United States Patent
McCue et al.

(10) Patent No.: US 9,065,472 B1
(45) Date of Patent: Jun. 23, 2015

(54) MULTI-FUNCTION RECONFIGURABLE DELTA SIGMA DAC

(71) Applicant: The United States of America as represented by the Secretary of the Air Force, Washington, DC (US)

(72) Inventors: Jamin McCue, Columbus, OH (US); Vipul J. Patel, Dayton, OH (US); Waleed Khalil, Dublin, OH (US); Brian Dupaix, Columbus, OH (US); Tony Quach, Lebanon, OH (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 0 days.

(21) Appl. No.: 14/639,381

(22) Filed: Mar. 5, 2015

(51) Int. Cl.
  *H03M 3/00* (2006.01)
(52) U.S. Cl.
  CPC ............... *H03M 3/404* (2013.01); *H03M 3/50* (2013.01)
(58) Field of Classification Search
  CPC .......... H03M 3/404; H03M 3/50; H03M 3/30
  USPC ................................................. 341/143, 144
  See application file for complete search history.

(56) References Cited

U.S. PATENT DOCUMENTS 6,339,621 B1 * 1/2002 Cojocaru et al. ............... 375/247
7,312,737 B2 * 12/2007 Jungerman et al. ............ 341/141

OTHER PUBLICATIONS

Luschas, S.; Schreier, R.; Hae-Seung Lee, "Radio frequency digital-to-analog converter," Solid-State Circuits, IEEE Journal of, Sep. 2004, pp. 1462-1467.
Jerng, A.; Sodini, C.G., "A Wideband ΔΣ Digital-RF Modulator for High Data Rate Transmitters," Solid-State Circuits, IEEE Journal of, Aug. 2007, pages 1710-1722.
Balasubramanian, S.; Creech, G.; Wilson, J.; Yoder, S. M.; McCue, J. J.; Verhelst, M.; Khalil, W., "Systematic Analysis of Interleaved Digital-to-Analog Converters," Circuits and Systems II: Express Briefs, IEEE Transactions on, Dec. 2011, pp. 882-886.

(Continued)

*Primary Examiner* — Khai M Nguyen
(74) *Attorney, Agent, or Firm* — AFMC LO/JAZ; Jason Sopko

(57) ABSTRACT

An interleaved digital to analog converter (DAC) includes at least a first signal path and a second signal path. The DAC further includes at least a first high speed DAC and a second high speed DAC each having an input and an output. The first signal path and the second signal path are electrically coupled to the first high speed DAC input and the second high speed DAC input, respectively. The DAC also includes a zero phase clock signal supplied to the first high speed DAC and a 180° phase shifted clock signal supplied to the second high speed DAC. A summation circuit, having at least two inputs and one output, is coupled to the outputs of the first high speed DAC and the second high speed DACs. A high-pass delta sigma modulator, a low-pass delta sigma modulator, a band pass delta sigma modulator, or notch filter delta sigma modulator is coupled between the first signal path and the first high speed DAC. A second a high-pass delta sigma modulator, a second low-pass delta sigma modulator, a second band pass delta sigma modulator, or a second notch filter delta sigma modulators electrically coupled between the second signal path and the second high speed DAC.

5 Claims, 7 Drawing Sheets

(56) References Cited

OTHER PUBLICATIONS

Ong, A.K.; Wooley, B.A., "A two-path bandpass ΔΣ modulator for digital IF extraction at 20 MHz," Solid-State Circuits, IEEE Journal of, vol. 32, No. 12, pp. 1920, 1934, Dec. 1997, 3 pages.

Balasubramanian, S.; Khalil, W., "Direct digital-to-RF digital-to-analogue converter using image replica and nonlinearity cancelling architecture," Electronics Letters, vol. 46, No. 14, pp. 1030, 1032, Jul. 2010.

* cited by examiner

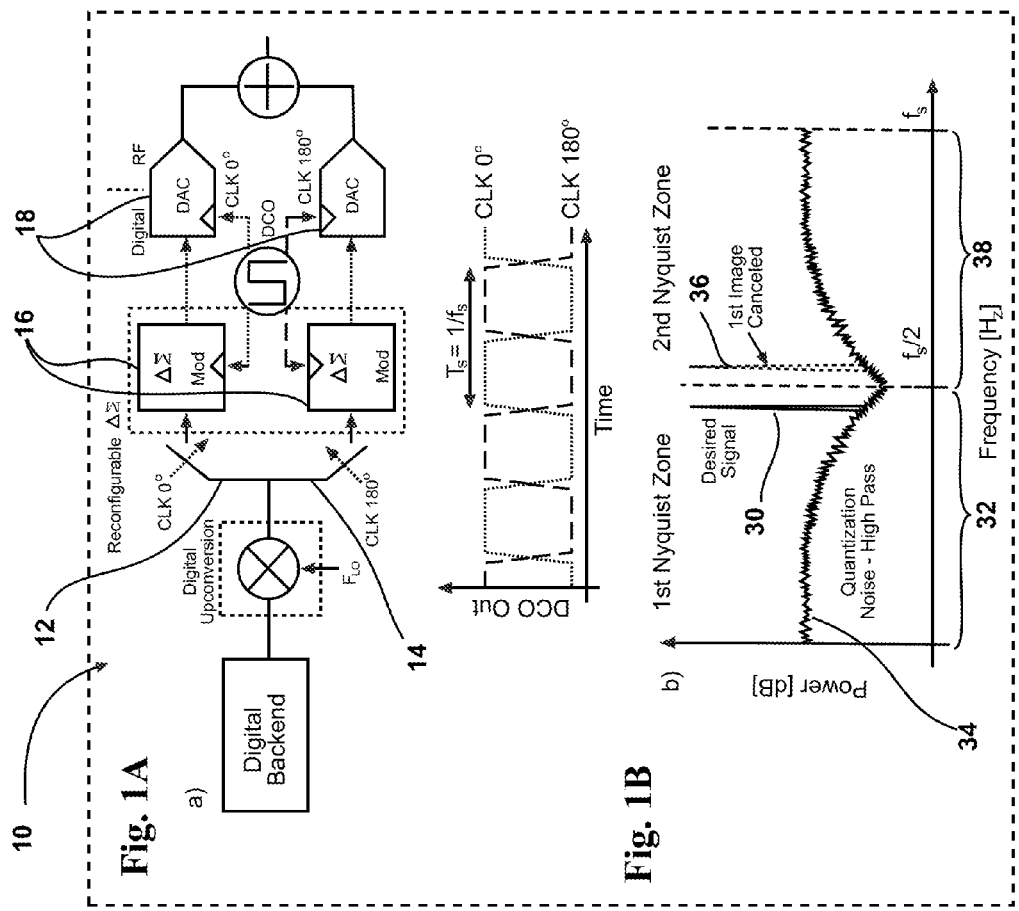

MULTI-FUNCTION RECONFIGURABLE DELTA SIGMA DAC

RIGHTS OF THE GOVERNMENT

The invention described herein may be manufactured and used by or for the Government of the United States for all governmental purposes without the payment of any royalty.

FIELD OF THE INVENTION

The present invention relates generally to digital-to-analog converters and, more particularly, to digital-to-analog converters that may be reconfigured to accommodate varied carrier frequencies, bandwidths, waveforms, and scalable output powers.

BACKGROUND OF THE INVENTION

A Digital-to-Analog Converter (DAC) is a circuit that converts discrete digital measures of signal amplitude into a continuous analog electrical equivalent of the encoded signal. The amplitude and frequency are a specified digital number (for example, a 16 bit word) and the step time between words is the sampling rate (for example, 44,100 times per second). This process can be seen as a mathematical zero-order-hold approximation, wherein tops of bars having fixed width and discrete height (digital amplitudes at a fixed sample rate) are used to approximate continuous analog signals. In such a system, the number of discrete heights defines the DAC's resolution, and the width of each bar is determined by the DAC sampling rate. The goal of the DAC is to adjust the top of each discrete bar to coincide with the level specified by the digital word. Some techniques used to accomplish this include: binary, unary, and delta sigma, and each has its own limitations and requirements.

In binary weighting, individual DAC cells take on discrete amplitudes that increase by multiples of two. The weightings are such that any signal height within the DAC range can be achieved by summing DAC cells to yield the desired amplitude. For example, an amplitude of five would be constructed from a cell of amplitude one and a cell of amplitude four. The accuracy of this method depends on the ability of each cell to match its particular multiple-of-two value.

In unary weighting, each DAC cell takes on the same amplitude. By summing enough cells, any amplitude, up to the maximum number of DAC cells, can be achieved. To reach an amplitude of five, five cells of weight one must be summed. While unary weighting is generally more accurate than binary due to the replication of identical cells, the unary method requires many more DAC cells to operate.

Finally, delta sigma DACs generate the desired signal amplitude by using very few (often just one) DAC cells. The cell is operated at dramatically higher speeds than the signal and alternately exceeds or under represents the desired signal. On average and over a large number of samples, the signal is constructed. By tracking the delta sigma error and filtering any high frequency noise, very high accuracy can be achieved. This is especially true because only a small number of unary cells are needed.

In RF-DAC design, both high bandwidth and low noise floor are desired, but it is often difficult to maximize both of these characteristics in a single design. Delta sigma modulators are used to shape quantization noise away from a transmitted signal, thus relaxing the necessary resolution of the DAC through delta sigma modulation, lowering the noise floor in only the output band. The difficulty with such methods is the narrow bandwidth over which the noise can be shaped away. This leads to a low noise floor but also to a reduced bandwidth.

A common example of this is the embedded mixer delta sigma modulator. A low pass delta sigma modulator operates on a baseband signal followed by analog or pseudo-analog up-conversion. The result of this transmitter architecture is a narrow band signal, limited by the low baseband sample rate, and a frequency agile single transmission band limited by the flexibility of the LO. While this may be acceptable for applications having a narrow range of anticipated signal frequencies, it produces designs that are inflexible and poorly suited to operate in varied signal environments. For example, since the waveform and frequency of target signals in an electronic signal intelligence gathering environment may be unknown, delta sigma modulators having a fixed filter configuration are ill suited to the noise reduction task under those circumstances. Additionally inaccuracies are imparted by the pseudo-analog up-conversion as compared to fully digital up-conversion.

Distinct from the embedded mixer methodology is the direct-digital-to-RF approach which uses digital up-conversion in lieu of analog frequency translation. Digital up-conversion has the advantages of being more accurate with respect to in-phase and quadrature (I/Q) phase, higher in bandwidth due to higher sampling frequencies, and more easily parallelizable (creating multiple frequency independent output signals). Unfortunately, the difficulty of this approach lies in the limited range of frequencies capable of being synthesized. Since the modulated RF signal is constructed in the digital domain, the sample rate of the system should be high enough to support accurate representation of the signal. However, common delta sigma modulators, such as the band-pass modulator, have maximum output frequencies of only ¼ of the sample rate. This leads to frequency synthesis at only a fraction of the digital clock. While delta sigma modulators, such as the high pass modulator, would significantly increase the maximum synthesizable frequency, they are not feasible in these designs because of the small offset between the output signal and the first DAC image.

Therefore, there exists a need in the art for a reconfigurable delta sigma DAC, having direct-digital-to-RF synthesis in a high speed low resolution configuration capable of increasing bandwidth and maximum frequency while removing unwanted signal images or aliases.

SUMMARY OF THE INVENTION

The present invention overcomes the foregoing problems and other shortcomings, drawbacks, and challenges of prior art DACs. While the invention will be described in connection with certain embodiments, it will be understood that the invention is not limited to these embodiments. To the contrary, this invention includes all alternatives, modifications, and equivalents as may be included within the spirit and scope of the present invention.

According to one embodiment of the present invention, an interleaved digital to analog converter (DAC) is provided. The DAC includes at least a first signal path and a second signal path. The DAC further includes at least a first high speed DAC and a second high speed DAC each having an input and an output. The first signal path and the second signal path are electrically coupled to the first high speed DAC input and the second high speed DAC input, respectively. The DAC also includes a zero phase clock signal supplied to the first high speed DAC and a 180° phase shifted clock signal supplied to the second high speed DAC. A summation circuit, having at least two inputs and one output, is coupled to the outputs of the first high speed DAC and the second high speed DACs. A high-pass delta sigma modulator, a low-pass delta sigma modulator, a band pass delta sigma modulator, or notch filter delta sigma modulator is coupled between the first signal path and the first high speed DAC. A second a high-pass delta sigma modulator, a second low-pass delta sigma modulator, a second band pass delta sigma modulator, or a second notch filter delta sigma modulator is electrically coupled between the second signal path and the second high speed DAC.

According to another embodiment of the disclosed invention, an interleaved digital to analog converter (DAC) is provided. The DAC includes at least a first signal path and a second signal path. The DAC further includes at least a first high speed DAC and a second high speed DAC each having an input and an output, wherein the first signal path and the second signal path are electrically coupled to the first high speed DAC input and the second high speed DAC input, respectively. A zero phase clock signal is supplied to the first high speed DAC and a 180° phase shifted clock signal is supplied to the second high speed DAC. The DAC further includes a summation circuit, having at least two inputs and one output, that is coupled to the outputs of the first high speed DAC and the second high speed DAC. A first reconfigurable delta sigma modulator is coupled between the first signal path and the first high speed DAC. A second reconfigurable delta sigma modulator is electrically coupled between the second signal path and the second high speed DAC.

Additional objects, advantages, and novel features of the invention will be set forth in part in the description which follows, and in part will become apparent to those skilled in the art upon examination of the following or may be leaned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments given below, serve to explain the principles of the present invention.

FIG. 1A is an architecture block diagram of an interleaved DAC, and corresponding clocking phase, according to an embodiment of the disclosed invention.

FIG. 1B is an illustration of the resulting output spectrum demonstrating high pass noise shaping and DAC image cancellation according to an embodiment of the disclosed invention.

Figure 2A:
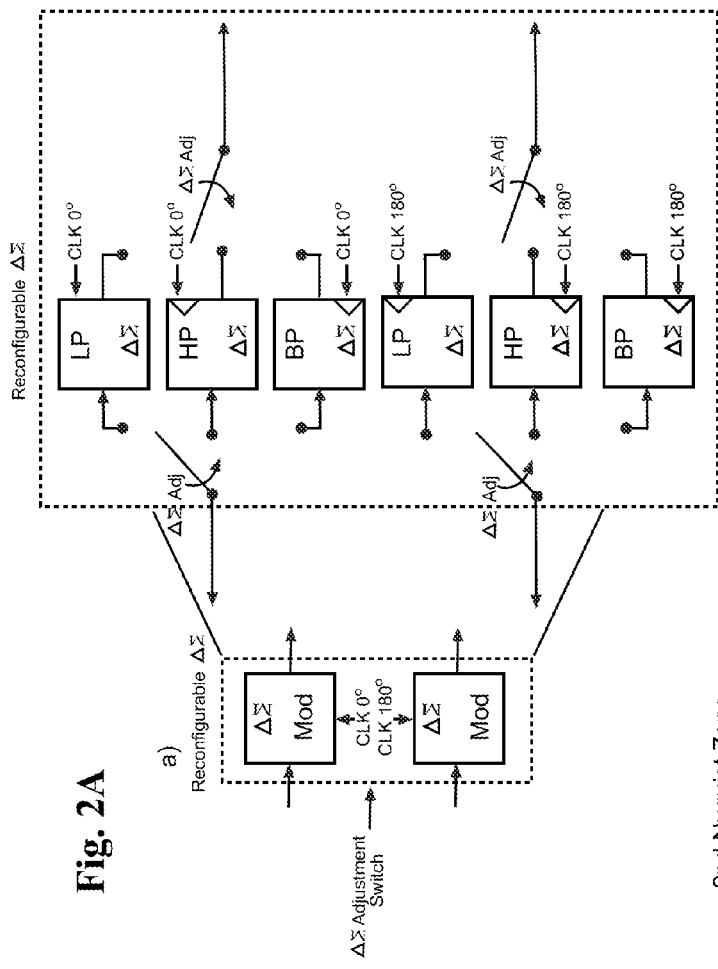
FIG. 2A is an architecture block diagram further detailing an implementation of a reconfigurable delta sigma modulator component of the interleaved DAC.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION OF THE INVENTION

With reference to FIG. 1A, an embodiment of the disclosed multi-function reconfigurable DAC 10 includes a parallel interleaved architecture whereby the undesirable high frequency images of the DAC are removed. As shown in FIG. 1A, data is alternately fed into a first signal path 12 and a second signal path 14 each including reconfigurable delta sigma modulator 16 and a high frequency 18 DAC. As discussed herein, the term "data" may refer to information conveyed either by a single transmission line or conductor, or a plurality conductors processed in parallel or serially. It should be noted that the input phase shifts of 0 and 180 degrees are accomplished in the digital domain during the delta-sigma operation. The opposite phase shift is realized with the DAC clocks of 0 and 180 degrees. The signal of interest is added in phase (thus increasing its magnitude), while the image signal is added out of phase, resulting in desirable destructive cancellation. By removing the DAC images, the high pass delta sigma architecture can be used to increase the maximum transmit frequency of the direct-digital-to-RF transmitter and increase its bandwidth by making use of multiple Nyquist zones for signal transmission. As will be explained in detail below, any of high pass, low pass, or band pass (or a combination thereof) delta sigma modulation may be employed to meet design objectives and performance requirements.

FIG. 1B is a graph of the output frequency spectrum exiting the DAC 10. The desired signal 30, in the first Nyquist zone 32 is prominently distinguished from the high pass quantitation noise 34. The first image 36, in the second Nyquist zone 38, has been cancelled allowing the interleaved DAC to utilize this higher Nyquist zone.

Additionally, the invention mimics the frequency agility of the embedded mixer topology by actively adjusting the embedded delta sigma modulator to cover large portions of the output spectrum. FIG. 2A provides detail to the reconfigurable delta sigma modulator 16. Within each reconfigurable delta sigma modulator block 16, a plurality of filtered modulators are available for selection. As shown here, the DAC 10 may toggle between using a high pass delta sigma modulator 40, a band-pass delta sigma modulator 42, or low-pass delta sigma modulator 46. Under most operating conditions, the reconfigurable delta sigma modulator 16 assigned to the first signal path 12 and the second signal path 14 are the same. As will be recognized by one of ordinary skill in the art, the reconfigurable delta sigma modulator 16 may be low-pass, or arbitrary filtering specifications as required to accomplish design objectives. The reconfigurable delta sigma modulator 16 is constructed in such a way that it can switch between different noise transfer functions. It should be noted that the reconfigurable delta sigma modulator 16 may be applied to only one of the high speed DACs 18 to achieve design objectives, to include accessing portions of the available spectrum shifted around various notch points, as well as in between them.

Figure 2B:
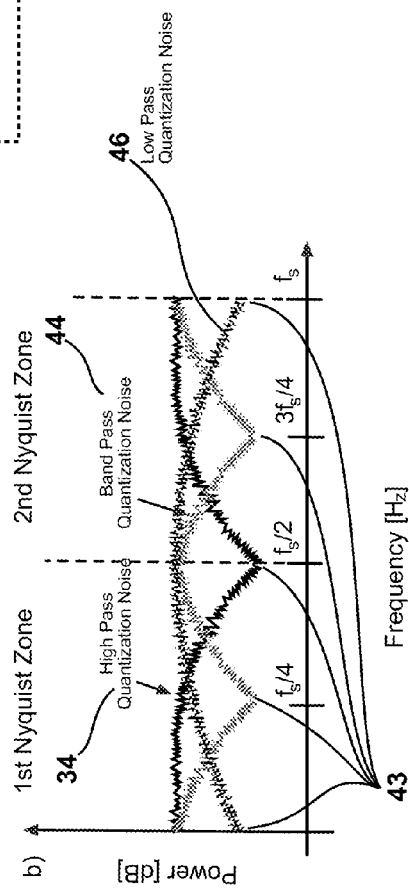
FIG. 2B is an illustration of the resulting output spectrum of both band-pass and high pass modes, showing normalized bandwidth available for output, in accordance with an embodiment of the disclosed invention.

FIG. 2B demonstrates this by showing the notches 43 in the high-pass quantitation noise 34 floor, the band pass quantization noise 44 floor, and the low pass quantization noise 46 floor at near DC, ¼, ½, ¾, and near the clocking frequency when the design is switched alternatively between a high-pass, low pass, and band pass configuration (by selecting a high-pass delta sigma modulator 40 or a band pass delta sigma modulator 42, respectively). Desired output frequencies between notches 43 can be achieved by either varying the clocking frequency, or by adding additional loop filters to more fully cover the output spectrum. By switching between several delta sigma loop filter configurations, the disclosed DAC 10 is able to effectively cover an entire Nyquist zone (0 to fs/2). With this architecture, a low resolution direct-digital-to-RF transmitter can synthesize a larger bandwidth and higher maximum frequency output without forfeiting the advantages of an all-digital architecture. It will be recognized that any of high-pass, band pass, low-pass, or arbitrary filter delta sigma modulation may be employed to accomplish design objectives.

The above noted architecture yields several significant advantages. It is noted that the design increases the available bandwidth, improves spectral tunability, and expands digital flexibility of low resolution RF-DACs while increasing overall I/Q modulation accuracy. While prior art systems often yield an inherent direct trade-off between bandwidth and maximum output frequency, the disclosed invention improves this trade-off by implementing a poly-phased/interleaved DAC and reconfigurable delta sigma modulator. As used herein, the terms "time-interleaved," "polyphased," "interleaved," and variations thereof, may be used interchangeably to describe a plurality of DAC components operating in concert under varied time domain conditions. The disclosed invention yields increased instantaneous bandwidth, wide coverage of the RF spectrum via the spectral-agility of a reconfigurable delta sigma modulator, poly-phased image cancellation, reprogrammable digital up-conversion and delta sigma modulation, high performance, low resolution digital-to-RF conversion, and flexibility to adjust the realized delta-sigma noise-transfer functions.

The disclosed invention is ideally suited to highly integrated silicon systems-on-chip, but is also applicable in lower density compound semiconductor technologies which have much higher process mismatch and lower digital capability. The disclosed RF-DAC architecture facilitates the creation of mixed signal RF synthesis in compound semiconductor technologies and eases the requirements of digital adjustment and calibration by reducing the number of bits needing adjustment without sacrificing in-band noise floor performance and frequency tunability.

The disclosed invention targets application spaces requiring lower part counts, multi-function capabilities, and reductions in size, weight, and power, all while maintaining existing performance benchmarks. The disclosed architecture permits multi-standard (for example, communications and radar) operation by implementing a single transmitter to cover wide bands and on-the-fly re-configurability to meet varying power and transmission requirements.

The following examples illustrate particular properties and advantages of some of the embodiments of the present invention. Furthermore, these are examples of reduction to practice of the present invention and confirmation that the principles described in the present invention are therefore valid but should not be construed as in any way limiting the scope of the invention.

Figure 3:
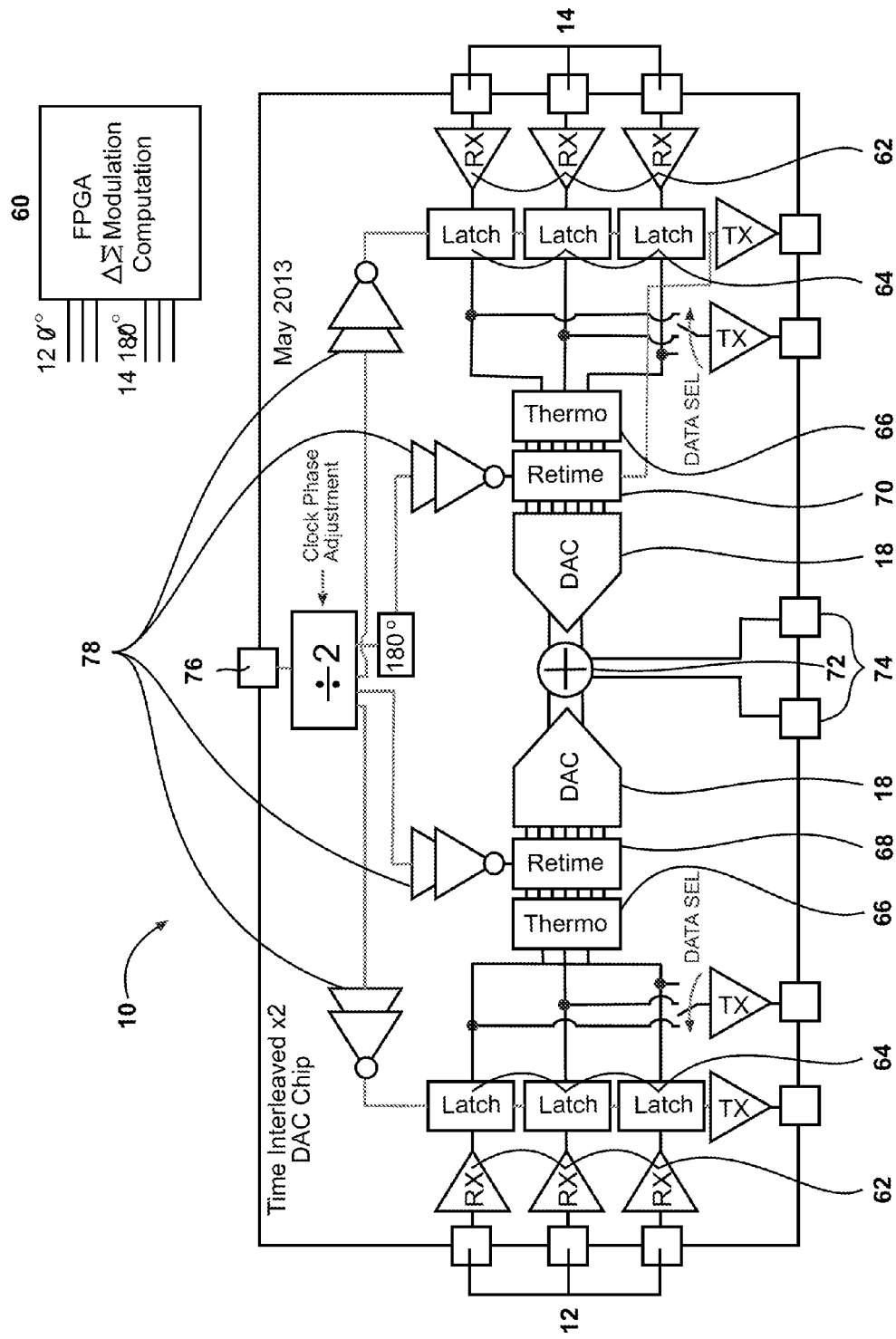
FIG. 3 is a schematic illustration of DAC interleaving on a single chip, with delta sigma modulation performed off chip (not shown in this view), in accordance with embodiments of the disclosed invention.

FIG. 3 illustrates a first construction of an embodiment of the disclosed invention. From the digital up-conversion, the RF modulated data is fed into parallel, reconfigurable delta sigma modulators 16 that are externally generated via an FPGA 60. In some embodiments of the disclosed invention, the FPGA may be substituted with application specific integrated circuits or off board software-based emulation. Here, the data is quantized and the error shaped away from the intended output frequency band lowering its noise floor. The loop filter of the reconfigurable delta sigma modulator 16 is varied based on the desired output frequency of the system such that the instantaneous output frequency can be swept across large portions of the output spectrum. The three lines of high-speed data are generated with a 0° phase (first signal path 12) and a 180° phase (second signal path 14) and fed into the integrated circuit via low voltage differential signaling (LVDS) receivers 62 where they are captured by latches 64. The data is translated from binary into thermometer code 66 and lastly retimed first signal 68 and retimed second signal 70 in order for the high speed DAC 18 to convert to an analog representation. Each high speed DAC 18 output is added via summing circuitry 72 and routed to the chip periphery 74. The summation circuit may operate in either a voltage or a current domain. In some embodiments of the disclosed invention, current summing may be accomplished by directly connecting two or more wires at a node. In other embodiments, voltage summing may be accomplished with a summing amplifier or buffer. In order to accomplish all the timing synchronizations, a high-speed off-chip clock is presented to the IC at clock insertion point 76 and divided by two in order to generate the 0° and 180° phases. With on-chip clock buffers 78, the clocking is routed to all the necessary blocks as depicted in FIG. 3.

After delta sigma modulation, the parallel data streams are timed to two anti-phase clocks and fed into two high speed DACs. This process interleaves the DAC output samples, effectively eliminating the first DAC images which can present as in-band interfering signals in RF-DACs.

Figure 4:
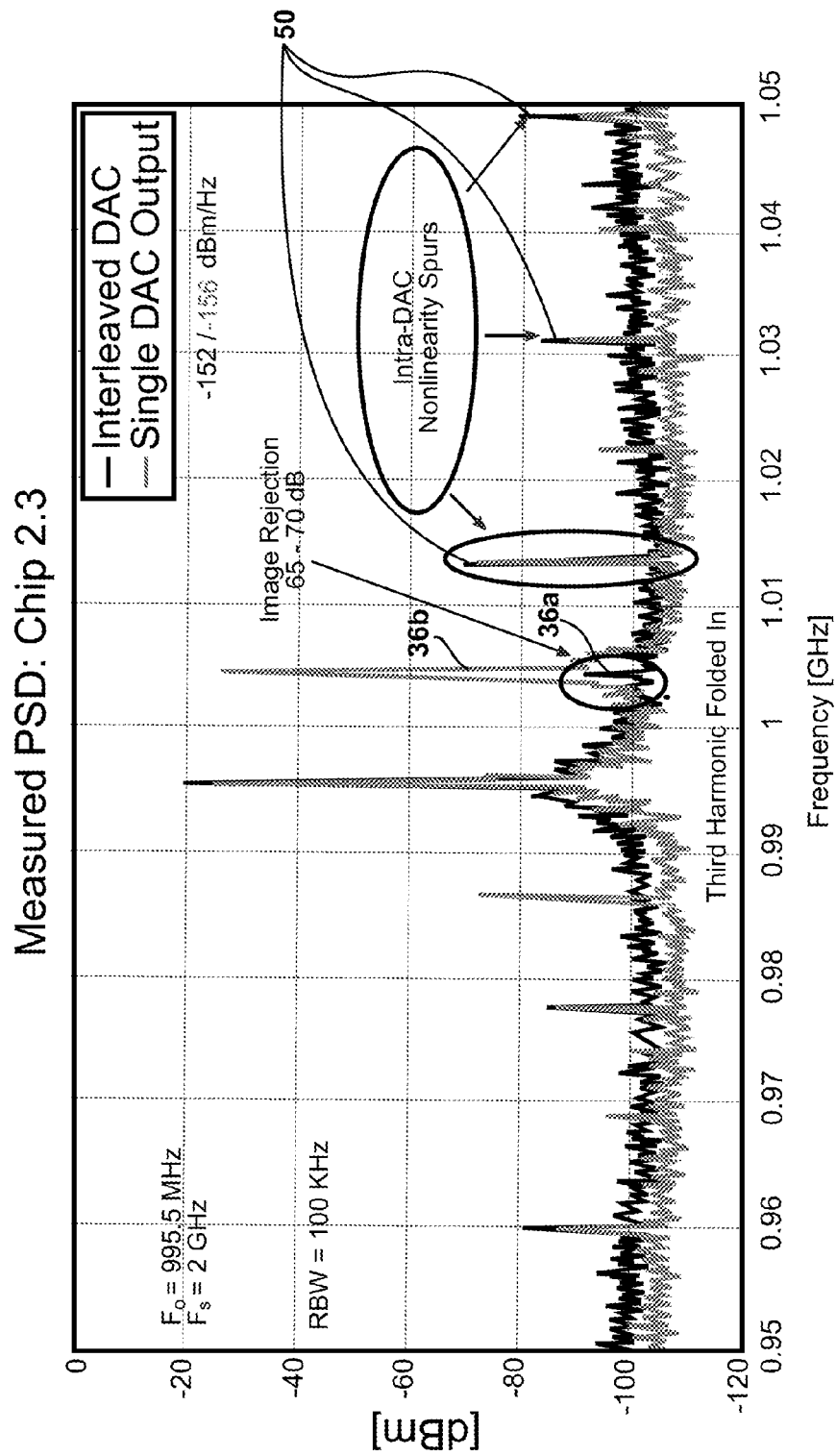
FIG. 4 is a graph representing frequency spectrum output corresponding to the circuit of FIG. 3, wherein a single delta sigma DAC output spectrum is compared with an interleaved delta sigma DAC output spectrum.

FIG. 4 is a graphical representation comparing the measured frequency spectrum of a single DAC output and the measured output of the disclosed interleaved DAC 10. It is noted that the first image 36a corresponding to the DAC 10 is far more desirably suppressed than the first image 36b corresponding to a single DAC configuration. The intra-DAC non-linearity spurs 50 are believed to be traced to a particular flip flop gate used in the design. The spurs 50 should not be construed as feature (beneficial or detrimental), of the disclosed DAC 10.

Figure 5:
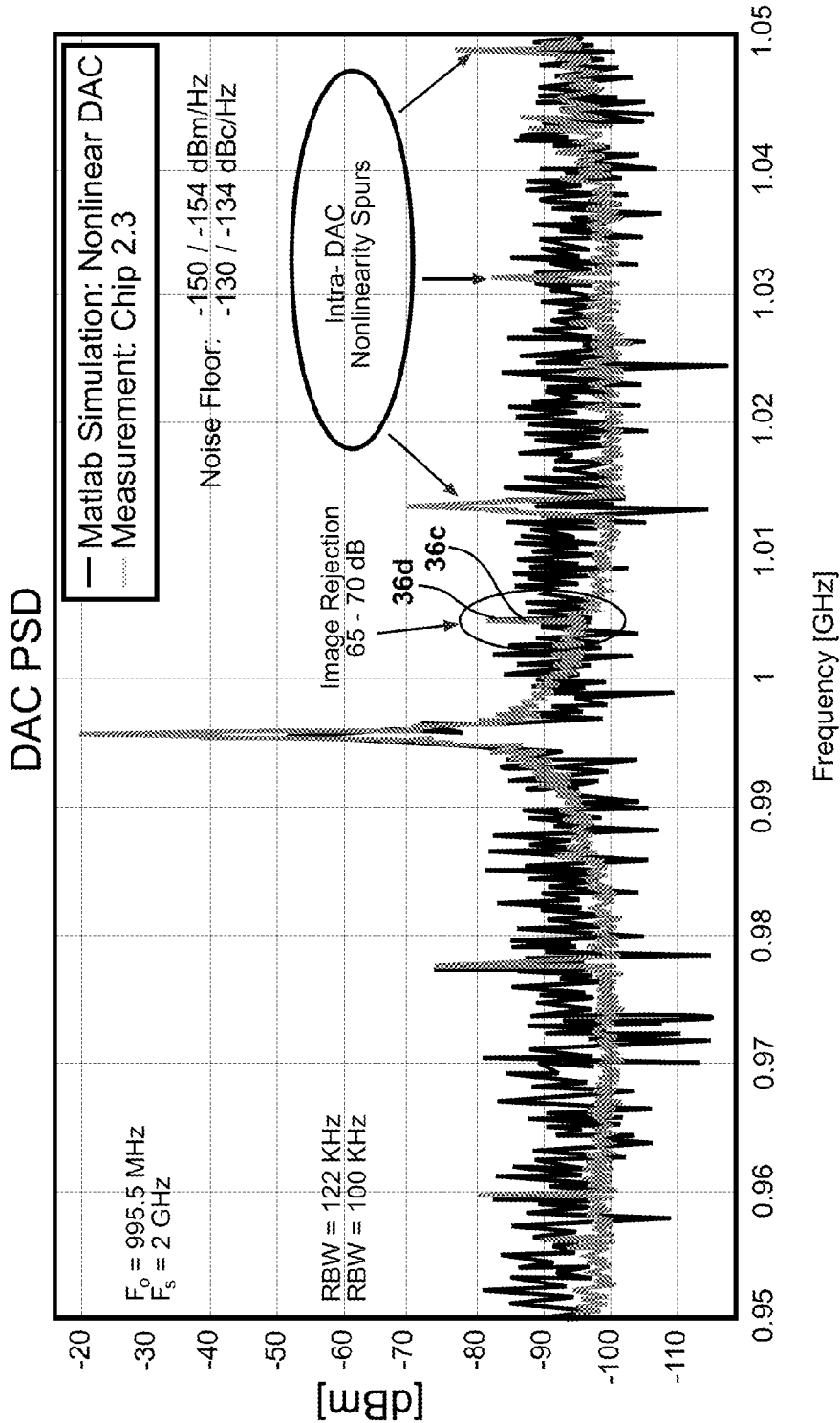
FIG. 5 is a graph representing frequency output spectrum corresponding to the circuit in FIG. 3, wherein both a software simulation output and an experimentally obtained output are compared.

FIG. 5 is a graphical representation comparing the frequency spectrum output as simulated with MATLAB® software as compared to experimental results. It should be noted that suppression of the first image 36c corresponding to the experimentally tested DAC 10 correlates closely to the suppressed first image 36d corresponding to the software simulation.

Figure 7:
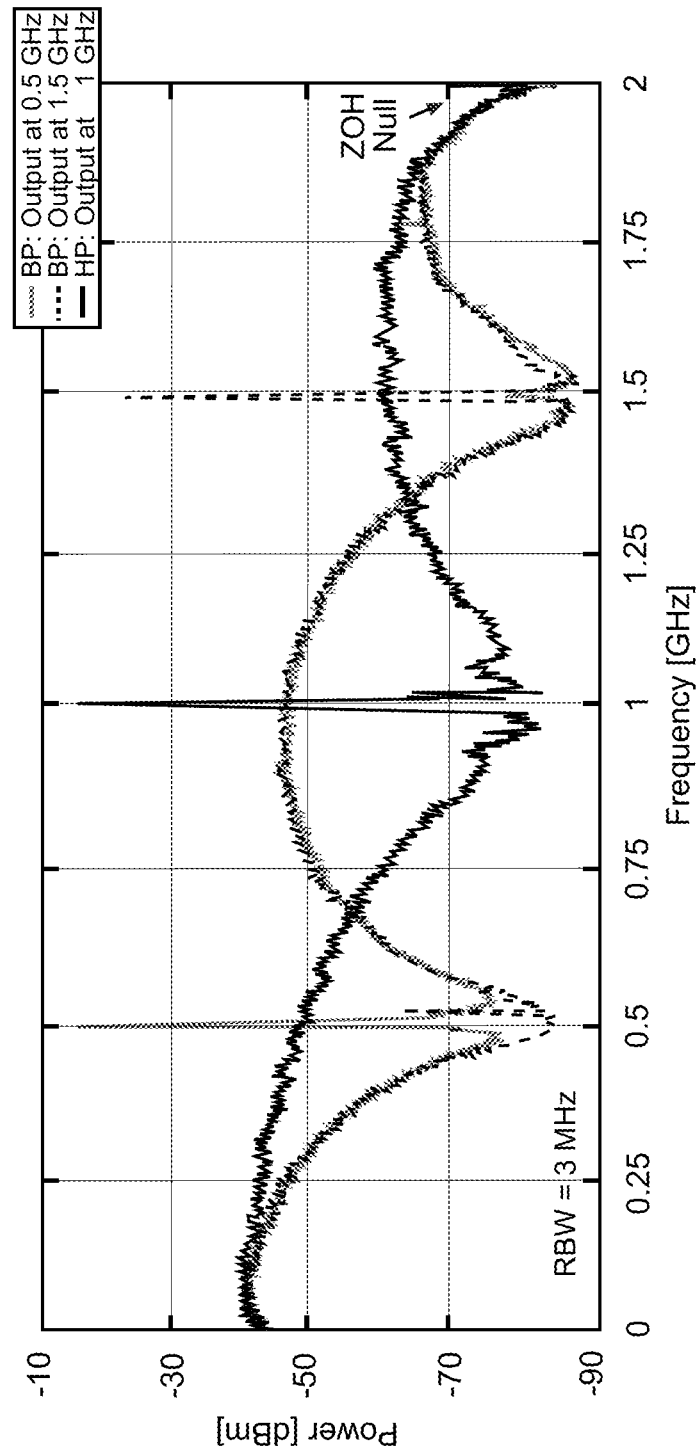
FIG. 7 is a graph representing the measured spectrum of the circuit in FIG. 3 from 0-2 GHz, demonstrating both the bandpass and highpass output spectra ideally shown in FIG. 2B.

FIG. 7 shows an expanded view of the measured DAC 10 spectrum from 0-2 GHz demonstrating both the bandpass and highpass output spectrums ideally shown in FIG. 2B. In this figure, DAC outputs at $f_s/4$, $f_s/2$, and $3f_s/4$ are shown.

Figure 6:
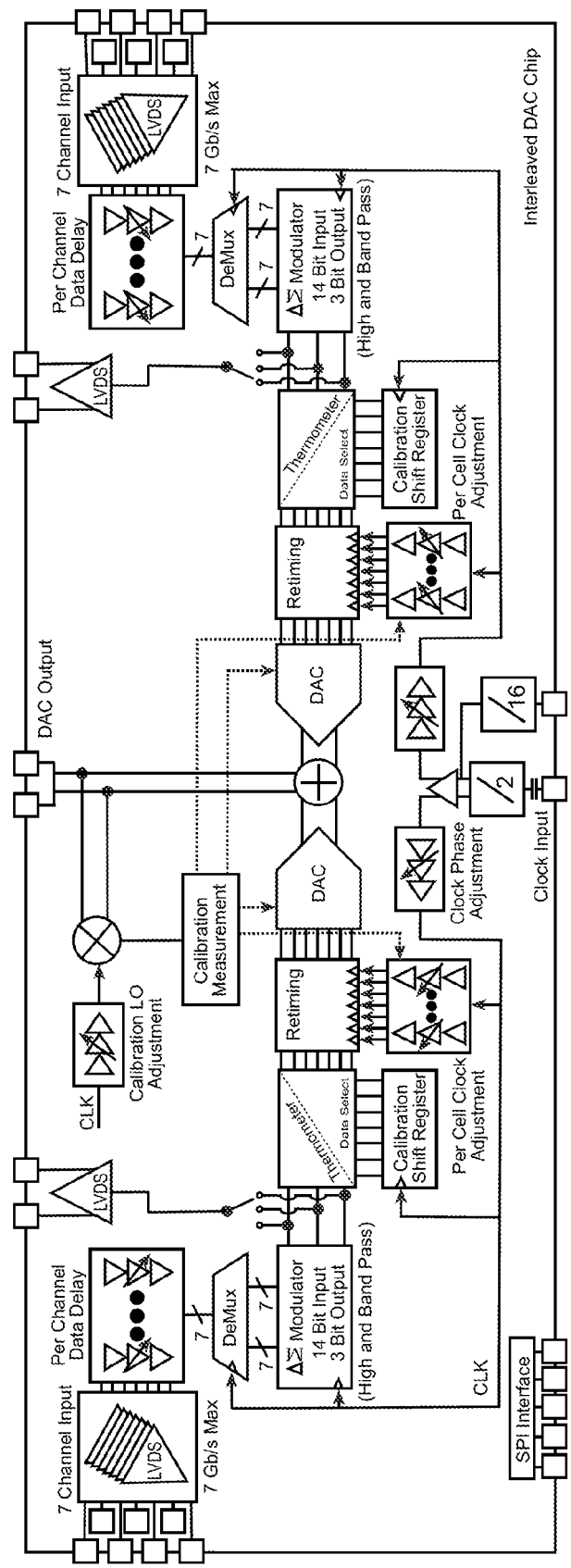
FIG. 6 is a schematic illustration of the interleaved DAC and delta sigma modulation on a single chip.

FIG. 6 is a schematic representation of another embodiment of the disclosed DAC 10. In this configuration, both the delta sigma modulation and DAC interleaving reside on a single chip. The modulation is reconfigurable via digital control lines, allowing the modulator to output one, two, or three bits of bandpass or highpass data. The modulator can also be adjusted to realize first, second, or third order delta sigma loop filters. For interleaving purposes, two identical modulators are included on chip to feed the interleaved DACs. It is believed that the image suppression performance should be comparable to the circuit of FIG. 3, but with the addition of customary economies realized by a single chip design.

In use, the disclosed invention enables utilization of the bandwidth between DC and $f_s$ by selective use of the elements as disclosed herein. For example, a signal may be transmitted at $f_s/4$ in the first Nyquist zone, while using the interleaving and band pass delta sigma modulation disclosed herein to suppress the corresponding undesirable image at $3f_s/4$ in the second Nyquist zone. Likewise, a transmission at $3f_s/4$ in the second Nyquist zone may be accomplished without the use of interleaving or filtering. If additional high speed DACs 18 are added, the available bandwidth may be increased past $f_s$. For example, bandpass delta sigma modulation results in a relationship of $(2n-1)(f/4)$ where n is the number of high speed DACs 18. For high pass delta sigma modulation, the relationship is $(2n-3)(f/2)$ where n is this time the even number of high speed DACs 18.

It will also be recognized by one of ordinary skill in the art that acceptable performance may be realized by use of the disclosed interleaved components adapted to an Analog to Digital Converter ADC configuration. While the disclosed invention has been described primarily as using two interleaved DACs, it will be recognized by one of ordinary skill in the art that design considerations may allow for a greater number of interleaved DACs, with correspondingly offset clock phases. For example, some embodiments may use a clock phase offset of $N/360°$, where N is the number of interleaved DACs.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. An interleaved digital to analog converter (DAC), the DAC comprising:
    at least a first signal path and a second signal path;
    at least a first high speed DAC and a second high speed DAC each having an input and an output, wherein the first signal path and the second signal path are electrically coupled to the first high speed DAC input and the second high speed DAC input, respectively;
    a zero phase clock signal supplied to the first high speed DAC and a 180° phase shifted clock signal supplied to the second high speed DAC;
    a summation circuit, having at least two inputs and one output, coupled to the outputs of the first high speed DAC and the second high speed DAC;
    a high-pass delta sigma modulator, a low-pass delta sigma modulator, a band pass delta sigma modulator, or notch filter delta sigma modulator coupled between the first signal path and the first high speed DAC; and
    a second a high-pass delta sigma modulator, a second low-pass delta sigma modulator, a second band pass delta sigma modulator, or a second notch filter delta sigma modulator electrically coupled between the second signal path and the second high speed DAC.

2. An interleaved digital to analog converter (DAC), the DAC comprising:
    at least a first signal path and a second signal path;
    at least a first high speed DAC and a second high speed DAC each having an input and an output, wherein the first signal path and the second signal path are electrically coupled to the first high speed DAC input and the second high speed DAC input, respectively;
    a zero phase clock signal supplied to the first high speed DAC and a 180° phase shifted clock signal supplied to the second high speed DAC;
    a summation circuit, having at least two inputs and one output, coupled to the outputs of the first high speed DAC and the second high speed DAC;
    a first reconfigurable delta sigma modulator coupled between the first signal path and the first high speed DAC; and
    a second reconfigurable delta sigma modulator electrically coupled between the second signal path and the second high speed DAC.

3. The DAC of claim 2, wherein the first reconfigurable delta sigma modulator or the second reconfigurable delta sigma modulator may be selectively toggle between a high-pass delta sigma modulator, a low-pass delta sigma modulator, a band pass delta sigma modulator, contained therein.

4. The DAC of claim 3, wherein the reconfigurable delta sigma modulator or the second reconfigurable delta sigma modulator further including an arbitrary waveform delta sigma modulator, wherein the math of the arbitrary waveform delta sigma modulator is configured to perform filtering distinct from the high-pass delta sigma modulator, the low-pass delta sigma modulator, the band pass delta sigma modulator, or the notch filter delta sigma modulator.

5. The DAC of claim 3 further including a digital up-conversion circuit electrically coupled to the first signal path and the second signal path, and disposed before to the first reconfigurable delta sigma modulator and the second reconfigurable delta sigma modulator, wherein the digital up-conversion circuit is configured to process an incoming signal wholly in the digital domain.

* * * * *